United States Patent [19]
Francis et al.

[11] Patent Number: 6,034,554
[45] Date of Patent: Mar. 7, 2000

[54] PHASE DETECTOR FOR HIGH SPEED CLOCK RECOVERY FROM RANDOM BINARY SIGNALS

[75] Inventors: John R. Francis; Atul Gupta, both of Burlington, Canada

[73] Assignee: Gennum Corporation, Burlington, Canada

[21] Appl. No.: 09/053,705

[22] Filed: Apr. 2, 1998

[30] Foreign Application Priority Data

Apr. 3, 1997 [CA] Canada ................................ 2201695

[51] Int. Cl.⁷ .................................................. H03D 13/00
[52] U.S. Cl. .................................................. 327/7; 327/12
[58] Field of Search .................. 327/12, 3, 6, 7, 327/2; 326/52; 375/375

[56] References Cited

U.S. PATENT DOCUMENTS

| | | | |
|---|---|---|---|
| 4,535,459 | 8/1985 | Hogge | 375/80 |
| 5,027,085 | 6/1991 | Devito | 331/1 A |
| 5,172,397 | 12/1992 | Llewellyn | 375/110 |
| 5,315,270 | 5/1994 | Leonowich | 331/11 |
| 5,321,369 | 6/1994 | Wolaver | 327/3 |
| 5,455,540 | 10/1995 | Williams | 331/1 A |
| 5,493,242 | 2/1996 | Simmons | 327/12 |
| 5,550,515 | 8/1996 | Liang et al. | 327/156 |

OTHER PUBLICATIONS

Thomas H. Lee, "A 155–Mhz Clock Recovery Delay—and Phase–Locked Loop", *IEEE Journal of Solid–State Circuits*- Dec. 27, (1992), No. 12, New York, US pp. 1736–1746.

*Primary Examiner*—Timothy P. Callahan
*Assistant Examiner*—An T. Luu
*Attorney, Agent, or Firm*—Bereskin & Parr

[57] ABSTRACT

An improved phase detector for detecting the difference between an information signal and a clock signal is provided. The information signal is divided into a plurality of N divided signals, the data rate of each divided signal being the data rate of the information signal divided by N. A plurality of N variable width difference pulse signals are generated each being responsive to the phase difference between a divided signal and the clock signal. One or more fixed width reference pulse signals having a width proportional to one-half clock period are also generated. A phase error signal is then provided in response to the N difference pulse signals and the one or more reference pulse signals. Preferably, N is equal to $2^M$, where M is a positive integer greater than or equal to one.

19 Claims, 17 Drawing Sheets

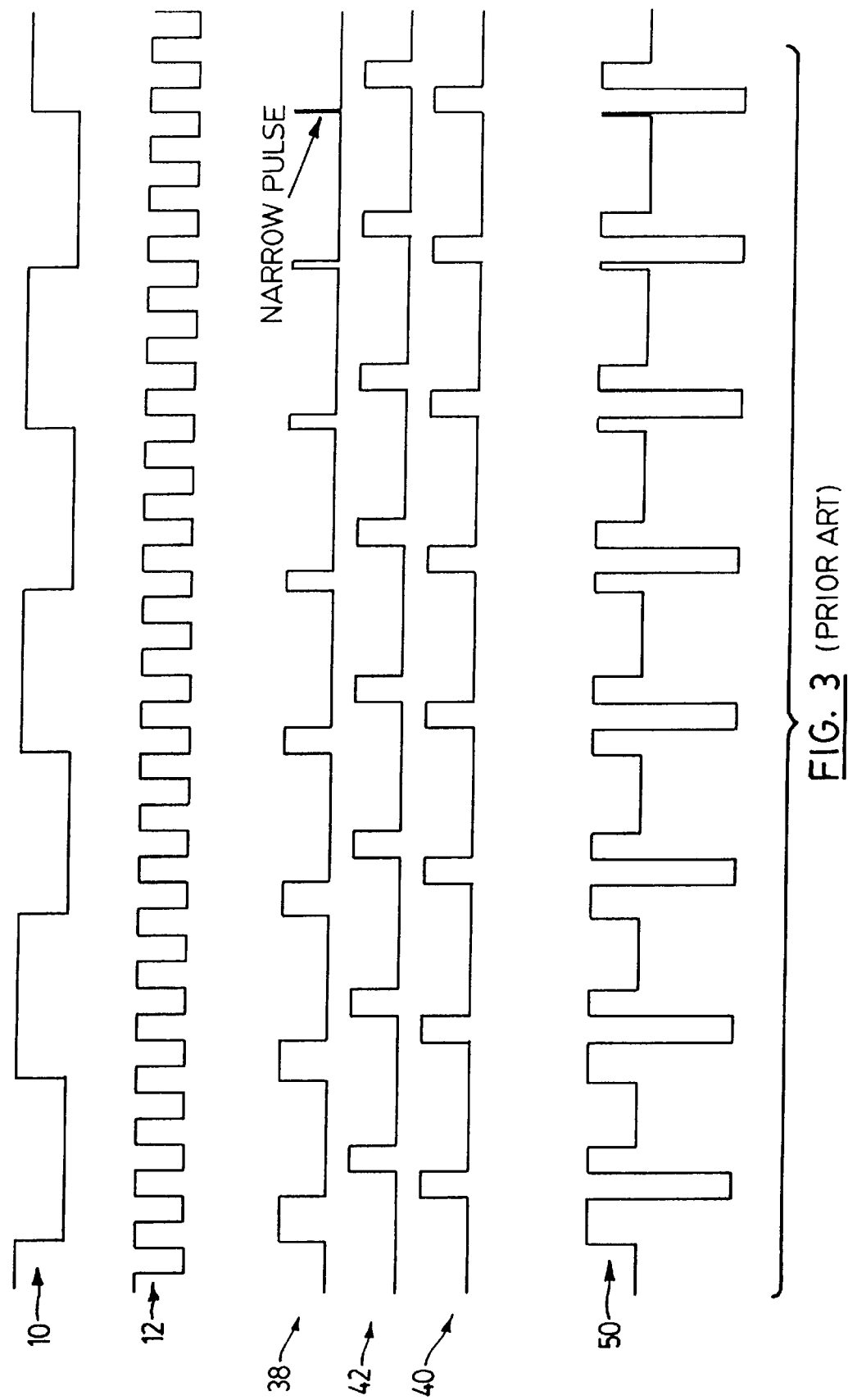

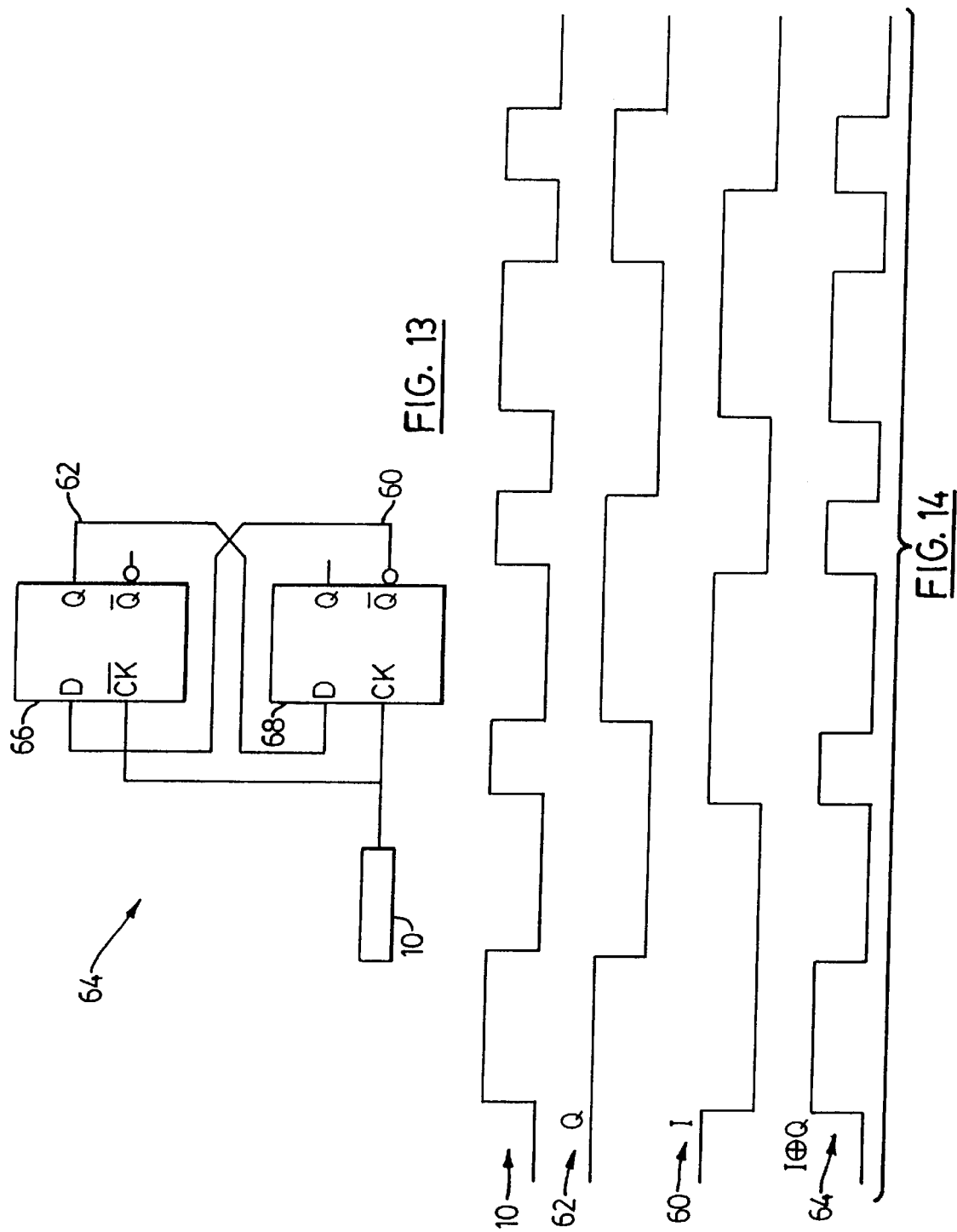

PHASE DETECTOR FOR HIGH SPEED CLOCK RECOVERY FROM RANDOM BINARY SIGNALS

FIELD OF THE INVENTION

The present invention relates to the field of data communications, clock recovery, clock recovery of non-self clocking signals, phase-locked loop clock recovery, phase detectors, and monolithic phase detectors. Specifically, the present invention is a phase detector, suitable for monolithic implementation, for use in a high speed phase-locked loop clock recovery system for non-return-to-zero data signals.

BACKGROUND OF THE INVENTION

Serial digital transmission of non-self clocking or non-return-to-zero (NRZ) binary signals requires receiving circuitry to extract timing information from the serial data to regenerate the clock. This recovered clock is used to re-time the serial data for subsequent circuitry to receive and process it synchronously. Most methods of clock recovery, especially when implemented monolithically, use phase-locked loops (PLLs). The PLL contains a voltage-controlled oscillator (VCO) which is controlled by an integrated and low pass filtered output of a phase detector. The phase detector output is representative of the phase difference between the input serial data and the recovered clock, the latter being equal to or derived from the VCO output.

The phase difference between an input NRZ data signal and a locally generated clock signal can be obtained by generating a variable control pulse signal proportional in width to that phase difference, in addition to one or more other fixed width control pulses. The control pulses are fed to control circuitry, such as a charge pump, which yields a phase detector output signal. The phase detector output signal is filtered and integrated to produce a phase error voltage signal which is then used to drive the VCO. A phase detector such as this was disclosed in U.S. Pat. No. 4,535,459 by Hogge and modified in U.S. Pat. No. 5,027,085 by DeVito to reduce phase jitter caused by variations in data density.

While the input to the VCO directly controls the frequency of the oscillator, frequency and phase are interdependent. For instance, a brief pulse in a constant input to the VCO would alter the frequency only momentarily but would subsequently result in a fixed change in the phase of the output. Therefore, the phase of the VCO output signal will only remain the same, before and after a series of changes in the VCO input signal, if the average value of those changes is zero (or equivalently if the average value of the integrated phase detector output signal does not change).

A phase detector for this application must generate phase difference information only when input data transitions occur. Ideally, the falling edge of the clock coincides with a data transition, so that the data is phase aligned for the rising edge of the clock to retime the data in the centre of the data interval. This condition ensures the most stable and reliable reading-in of the data. When it occurs there is said to be zero phase error, and the phase of the VCO output should not change. Phase jitter, which consists of spurious variations in the phase of the regenerated clock signal must therefore be minimized.

While current phase detector circuits, for example that disclosed in U.S. Pat. No. 5,027,085 by DeVito, may provide zero static phase offset, they do not provide zero phase offset in high speed applications where the input serial data itself has significant jitter (with respect to the clock) and where practical circuitry and subsequent circuitry have limited bandwidth. The result is a reduction in input jitter tolerance. It is therefore an object of the present invention to provide a phase detector circuit which provides minimal static phase offset in the presence of large input jitter, increases the input jitter tolerance, and allows for the use of circuitry with lower bandwidth and therefore with lower current consumption.

BRIEF SUMMARY OF THE INVENTION

In one aspect, the present invention provides a phase detector circuit for detecting a phase difference between an information signal and a clock signal and for producing a phase error signal representative of said phase difference, said clock signal and said information signal being pulse waveforms having first and second levels and having first and second edges, said information signal containing data at a certain data rate and said first and second edges of said information signal being data transitions, said phase detector circuit comprising: (a) a divider circuit for dividing said information signal into a plurality N of divided signals, the data rate of each of said divided signals being the data rate of said information signal divided by N; (b) a pulse signal circuit coupled to said divider circuit for producing a plurality N of variable width difference pulse signals, each of said difference pulse signals being responsive to the phase difference between one of said divided signals and said clock signal, the width of each of said difference pulse signals being not less than the width between said first and second edges of said clock signal, said pulse signal circuit further producing one or more fixed with reference pulse signals and the width of each of said one or more reference pulse signals being integrally proportional to the width between said first and second edges of said clock signal; and (c) a phase error signal circuit coupled to said pulse signal circuit for producing said phase error signal in response to said plurality of difference pulse signals and said one or more reference pulse signals.

Preferably, said divider circuit divides said information signal into a first divided signal and a second divided signal, the data rate of said first divided signal and said second divided signal being one half the data rate of said information signal, and said pulse signal circuit produces a first difference pulse signal responsive to the phase difference between said first divided signal and said clock signal, a second difference pulse responsive to the phase difference between said second divided signal and said clock signal, and said one or more reference pulse signals such that the time average of the changes in said phase error signal is zero when the second edge of said clock signal coincides with a data transition of said information signal.

BRIEF DESCRIPTION OF THE DRAWINGS

In the accompanying drawings which illustrate preferred embodiments of the present invention:

FIG. 3 is a timing diagram for the operation of FIG. 2A.

FIG. 13 shows a frequency divider circuit for the input data signal.

FIG. 14 is a timing diagram of the frequency division signals.

DETAILED DESCRIPTION OF THE PREFERRED EMBODIMENTS

Figure 1:
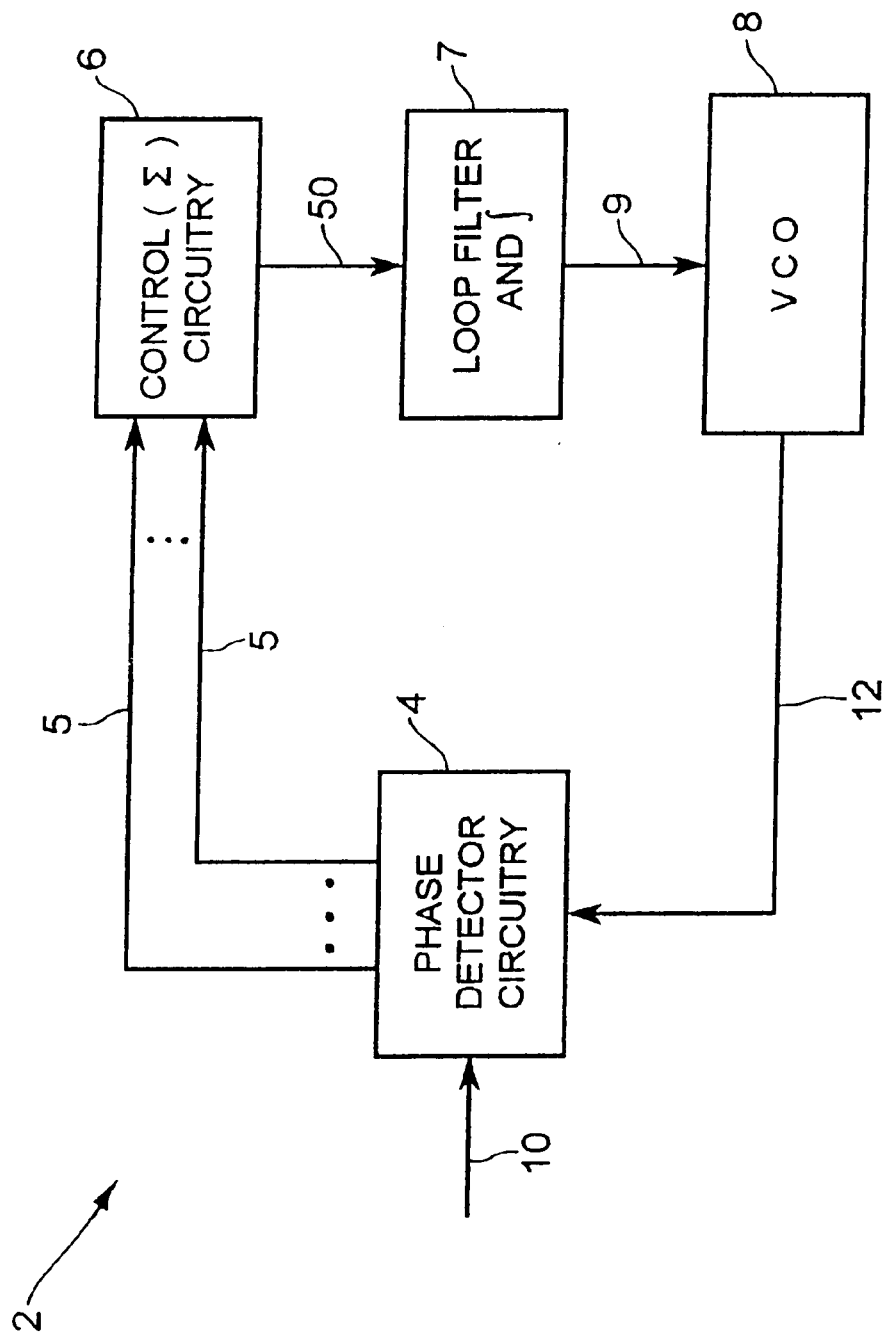
FIG. 1 is a block diagram illustrating a basic phase-locked-loop circuit configuration used for clock recovery.

FIG. 1 shows a basic circuit block diagram for a phase-locked loop (PLL) 2 used to recover or regenerate a clock signal 12 from input serial NRZ data 10. The phase detector circuitry 4 provides a plurality of control pulse signals 5 to the control (summing) circuitry 6 which outputs a phase detector output signal 50 in response. The phase detector output 50 is the input to loop filter and integrator 7. The output 9 of loop filter 7 is the phase error voltage signal which drives a voltage controlled oscillator (VCO) 8 whose output is essentially the recovered clock signal 12 which is fed back to gate (i.e. control the timing of) the phase detector circuitry 4.

Figure 2A:
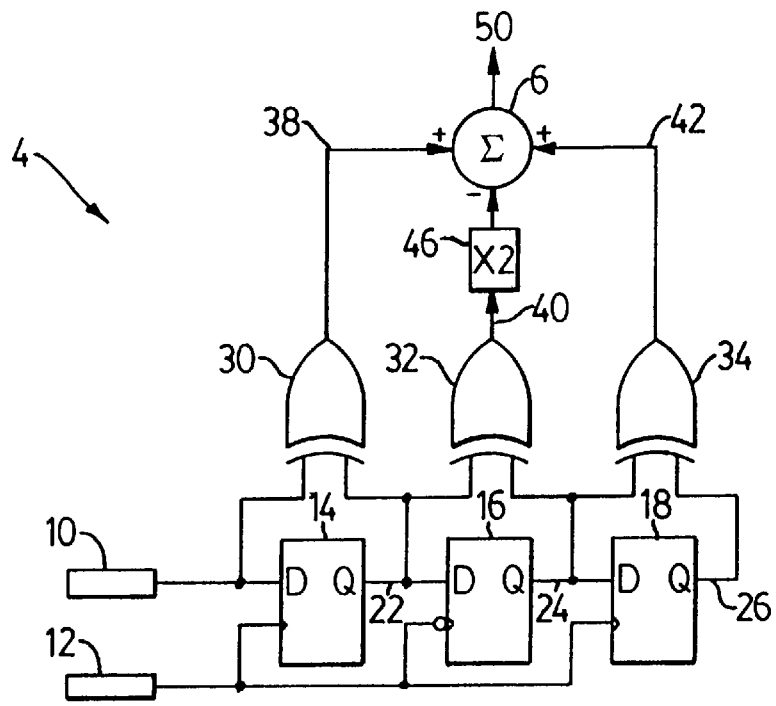
FIGS. 2A and 2B show prior art phase detector circuits.
Figure 2B:
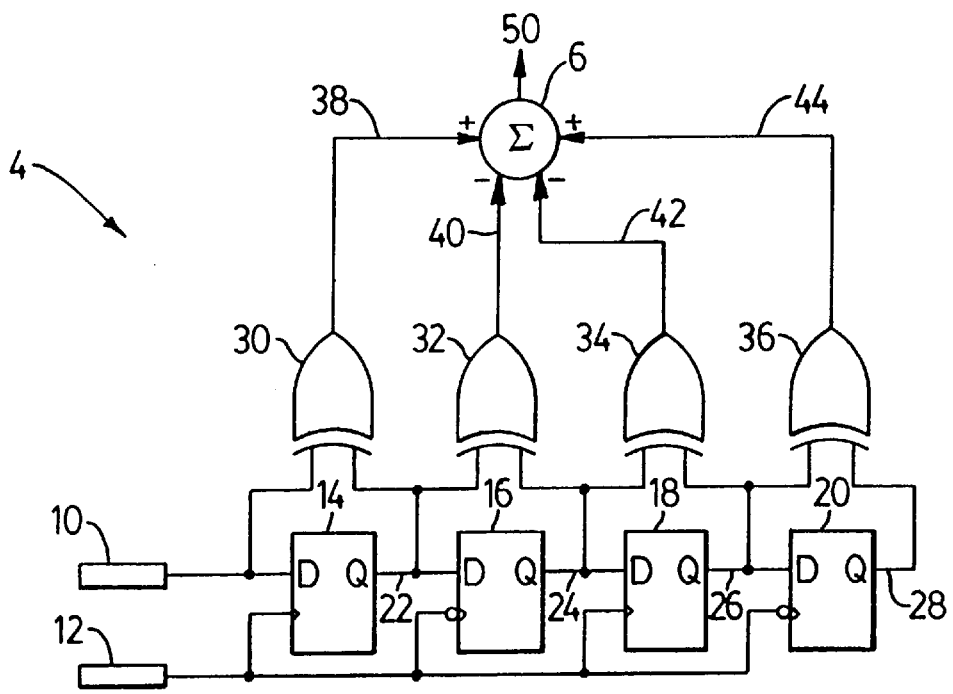

FIGS. 2A and 2B show two versions of the prior art phase detector circuit disclosed by Devito in U.S. Pat. No. 5,027,085. Referring to FIG. 2A, an input data signal 10 is connected to the input of a delay or retiming means 14, whose output 22 is connected to the input of a delay or retiming means 16, whose output 24 is in turn connected to the input of a delay or retiming means 18. The retiming means 14, 16, and 18 are all gated by alternate edges or levels (depending on the type of retiming means used) of the regenerated clock signal 12, which is derived from the phase detector output 50. In FIG. 2A, the retiming means 14, 16, and 18 are shown as D flip-flops and so are triggered by either the rising or falling edges of the regenerated clock signal 12. As shown in FIG. 2A, D flip-flops 14 and 18 are rising-edge triggered and D flip-flop 16 is falling edge triggered. The retiming means could also each consist of a master and slave combination of two D latches. It is obvious to those skilled in the art that the slave latch of one retiming means can perform the dual role of master latch in the next retiming means, thus allowing for the omission of redundant latches. In this manner, the retiming means 14, 16, and 18 can consist of a "series" combination of 4 latches.

The control pulse signals UP1 38, DOWN 40, and UP2 42 are generated by exclusive-OR (XOR) gates 30, 32, and 34 respectively. The inputs to XOR gate 30 are the input data signal 10 and the output 22 of retiming means 14. The inputs to XOR gate 32 are the output 22 of retiming means 14 and the output 24 of retiming means 16. The inputs to XOR gate 30 are the output 24 of retiming means 16 and the output 26 of retiming means 18. Before being fed to a control summing circuit 6, the DOWN signal 40 is doubled at the multiplier 46. At the summing circuit 6, the UP1 signal 38 and the UP2 signal 42 are summed positively and the DOWN signal 40 is summed negatively. The output of the summer is the phase detector output 50 from which the regenerated clock signal 12 is derived.

The circuit of FIG. 2B shows the phase detector of FIG. 2A with an additional retiming means 20 whose input is the output 26 of retiming means 18. A fourth control pulse signal 44 is generated by XOR gate 36 whose inputs are the output 26 of retiming means 18 and the output of retiming means 20. The presence of an additional control signal 44 obviates the requirement of doubling the DOWN control signal 40 before summing.

FIG. 3 shows a timing diagram for the operation of the circuit of FIG. 2A. In FIG. 3, the data (or bit) rate for signal 10 is lower than the frequency of the clock signal 12. For the purpose of illustration, the clock signal 12 is also shown as a constant frequency and phase signal. In operation, however, the clock signal will change in response to the phase detector output signal 50 when the time average of the changes in the filtered and integrated phase detector output signal (the phase error signal) is non-zero.

Figure 4:
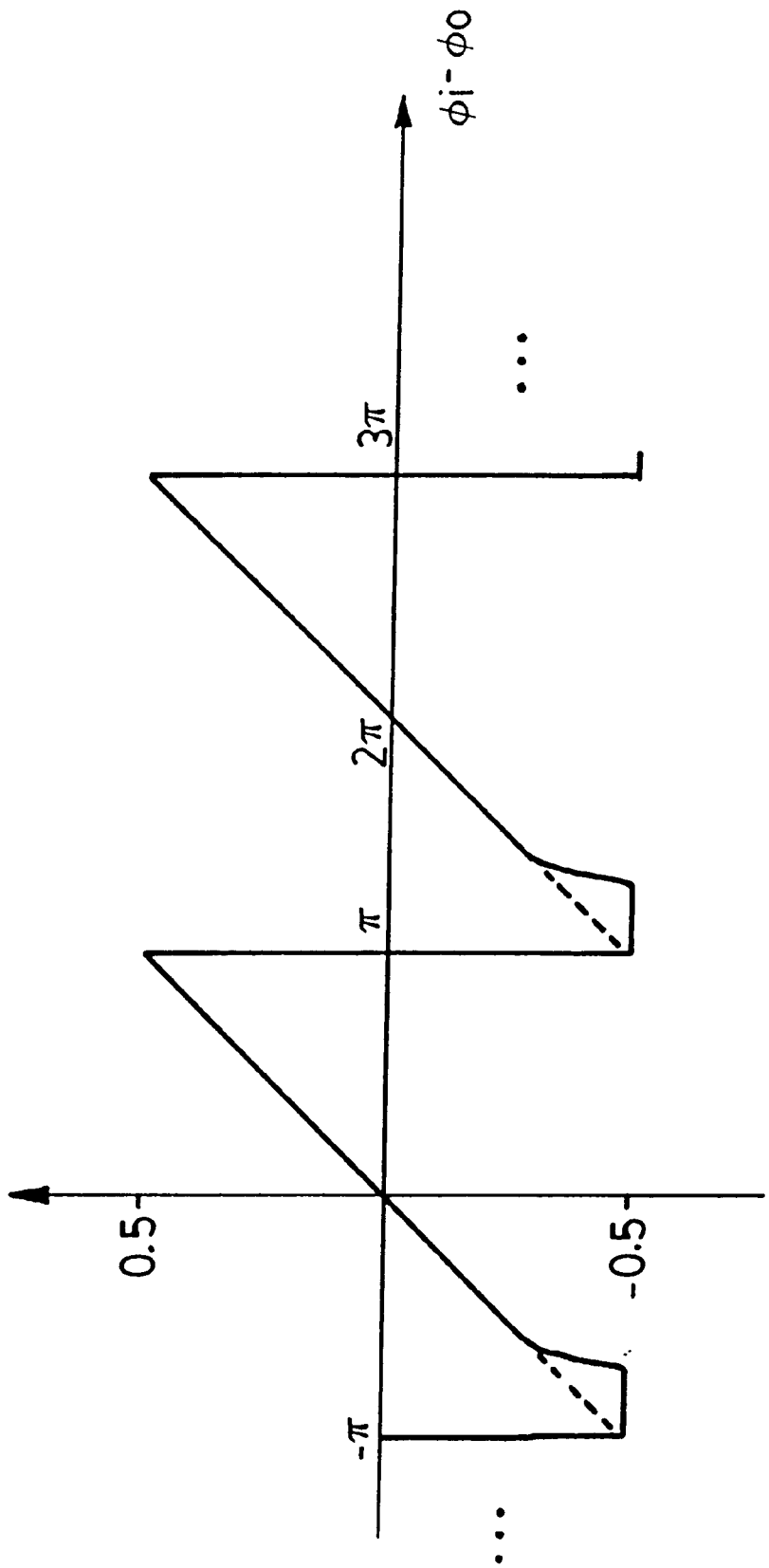
FIG. 4 shows the phase detector transfer function for the phase detector of FIGS. 2A or 2B.

Referring to FIG. 3, it is observed that the UP1 pulses can vary in pulse width between zero and one period of the clock signal 12. As the input data lags the clock, the positive UP1 pulses become more and more narrow. In practical XOR gates and control circuits, such as charge pumps, there is a limit for the response time of the circuit which results in effectively narrowing or eliminating input pulses which are too narrow. Therefore, as the UP1 pulses become narrower and narrower, they are ultimately filtered out and do not provide any pulse information for driving the VCO. In such cases and also in the case of high speed applications, the phase detector transfer function has a non-linearity which is shown in FIG. 4. As described below, this non-linearity can cause a significant reduction in input jitter tolerance for the phase detector circuits of FIGS. 2A and 2B.

Figure 5:
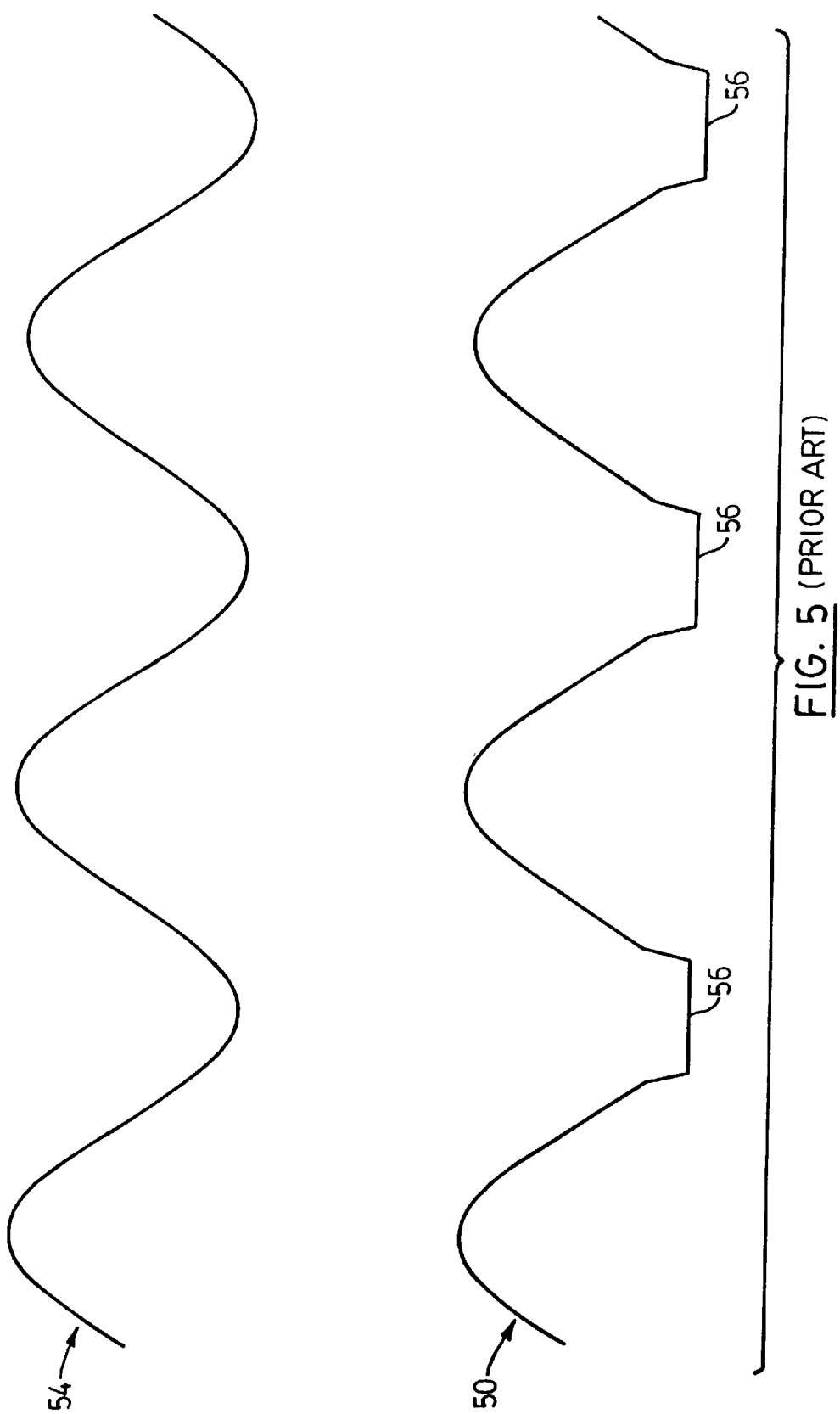
FIG. 5 shows the time response of the phase detector of FIGS. 2A or 2B.

Referring to FIG. 4, The non-linearity of the phase detector transfer function is not symmetrical about the phase difference between the input data and clock signals ($\phi_i - \phi_o$) axis 52, and results in a non-zero average phase detector output when the phase difference has large enough amplitude. FIG. 5 illustrates the low pass filtered time response of the non-linear phase detector transfer function to an input in which the data rate equals the clock frequency and the two signals have a sinusoidal phase difference 54. The non-linear distortion 56 results in an average negative phase detector output. When this occurs, the PLL circuit responds by decreasing the phase of the VCO output or clock until the average phase error is zero. As a result, a phase offset will occur in the presence of large input jitter, which, in turn, translates into a reduction in input jitter tolerance.

FIGS. 6 through 12 show several possible embodiments of a phase detector circuit 4' of the present invention. In all of the illustrated embodiments of the present invention, the input serial data is initially frequency divided by two, resulting in an "in-phase" data signal I and a data signal Q in "phase quadrature" with the input signal 10. FIG. 13 shows an example of a circuit 64 which performs the dividing function via latches 66 and 68, and FIG. 14 is a timing diagram of the signals involved, ignoring propagation delays. The signals I 60 and Q 62 effectively contain every other data transition from the input signal 10. The data signal I 60 toggles at each rising edge of the signal 10, and the data signal Q 62 toggles at each falling edge of the signal 10, so that when the signal 10 is low I and Q are at the same level and when the signal 10 is high I and Q are at different levels. As a result, the original input data signal can be regenerated by an XOR function of the two divided data signals, as shown at 64 in FIG. 13. Alternatively, the input serial data could also be frequency divided by an integral number greater than two and then recombined in a manner similar to that just described.

Referring back to FIG. 6, a first embodiment of the present invention is shown which divides at 64 the input signal 10 and then processes each divided signal 60 and 62 through a series of retiming means, shown in FIG. 6 as flip-flops. The independent processing of each divided 60 and 62 signal is similar to the processing of the complete input data signal 12 which took place in FIG. 2A. The signal Q 62 passes through three retiming means 14', 16', and 18' and generates three control pulse signals 38', 40' and 42' via XOR gates 30', 32', and 34'. The signal I 60 passes through another three retiming means 14", 16", and 18" and generates three control pulse signals 38", 40" and 42" via XOR gates 30", 32", and 34". The retiming means are gated by alternate edges (if the retiming means are flip-flops) or alternate levels (if the retiming means are slave-latch combinations) of the clock signal 12. Corresponding retiming means in each processing stream are similarly gated. For example and as shown in FIG. 6, the flip-flops 14', 14", 18', and 18" are rising edge triggered and the flip-flops 16' and 16" are falling edge triggered.

To eliminate the non-linearity present in the phase detector of FIGS. 2A and 2B, the inputs to the XOR gate 30' are the signal Q 62 and the output 24' of the retiming means 16'. Similarly, the inputs to the XOR gate 30" are the signal I 60 and the output 24" of the retiming means 16". As a result, the signals 38' and 38" have a minimum pulse width of one half of a clock period. Due to the lengthening of the 38' and 38" pulses the multipliers 46' and 46" multiply by three as compared to by two in FIG. 2A. The resolution of control signal pulses for consecutive data transitions in the input signal 10 remains possible, in spite of the lengthening of the pulse widths of signals 38' and 38", because of the initial frequency division of that signal.

Figure 6:
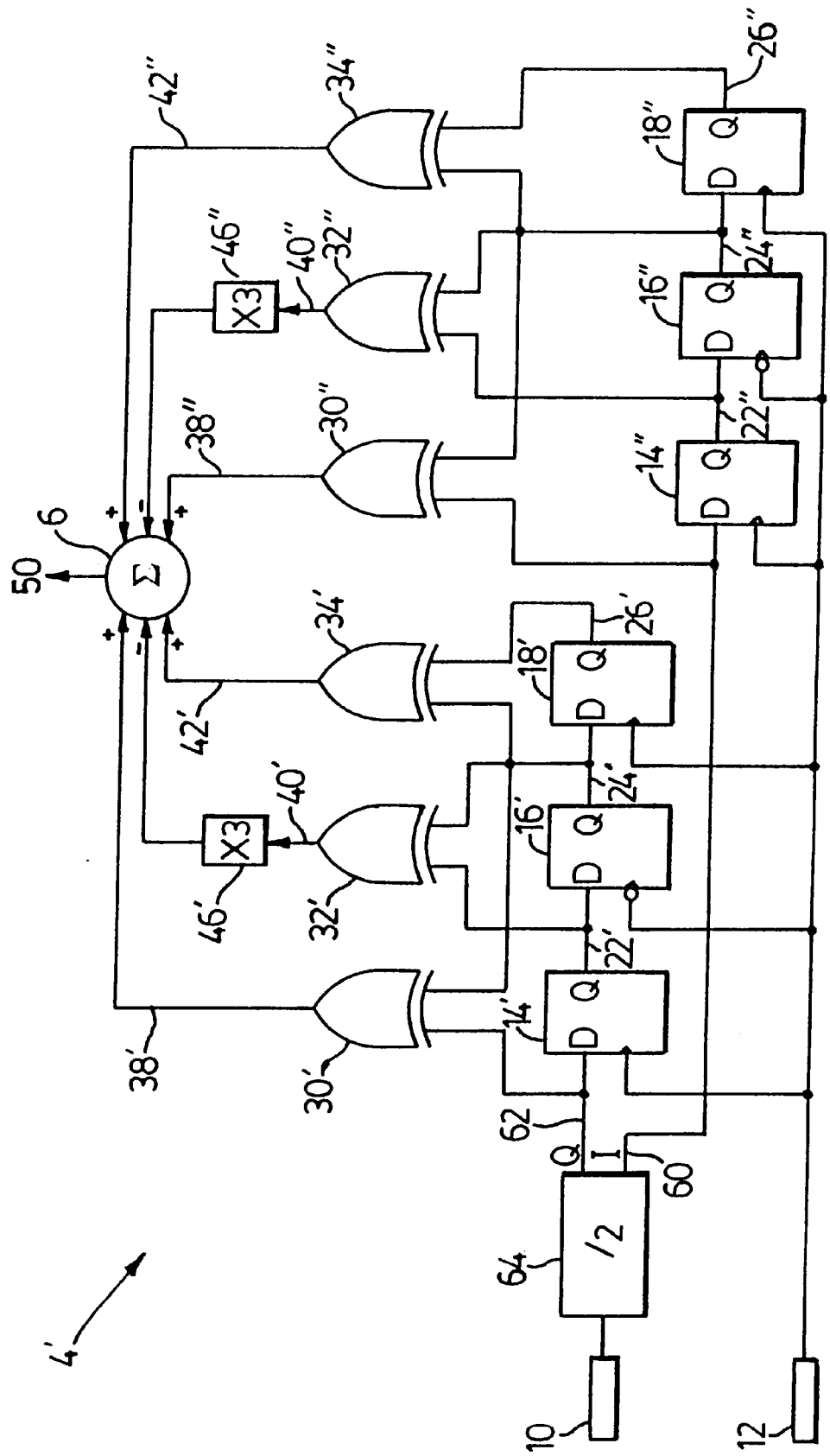
FIGS. 6 through 12 show several embodiments of the phase detector circuit of the present invention.
Figure 7:
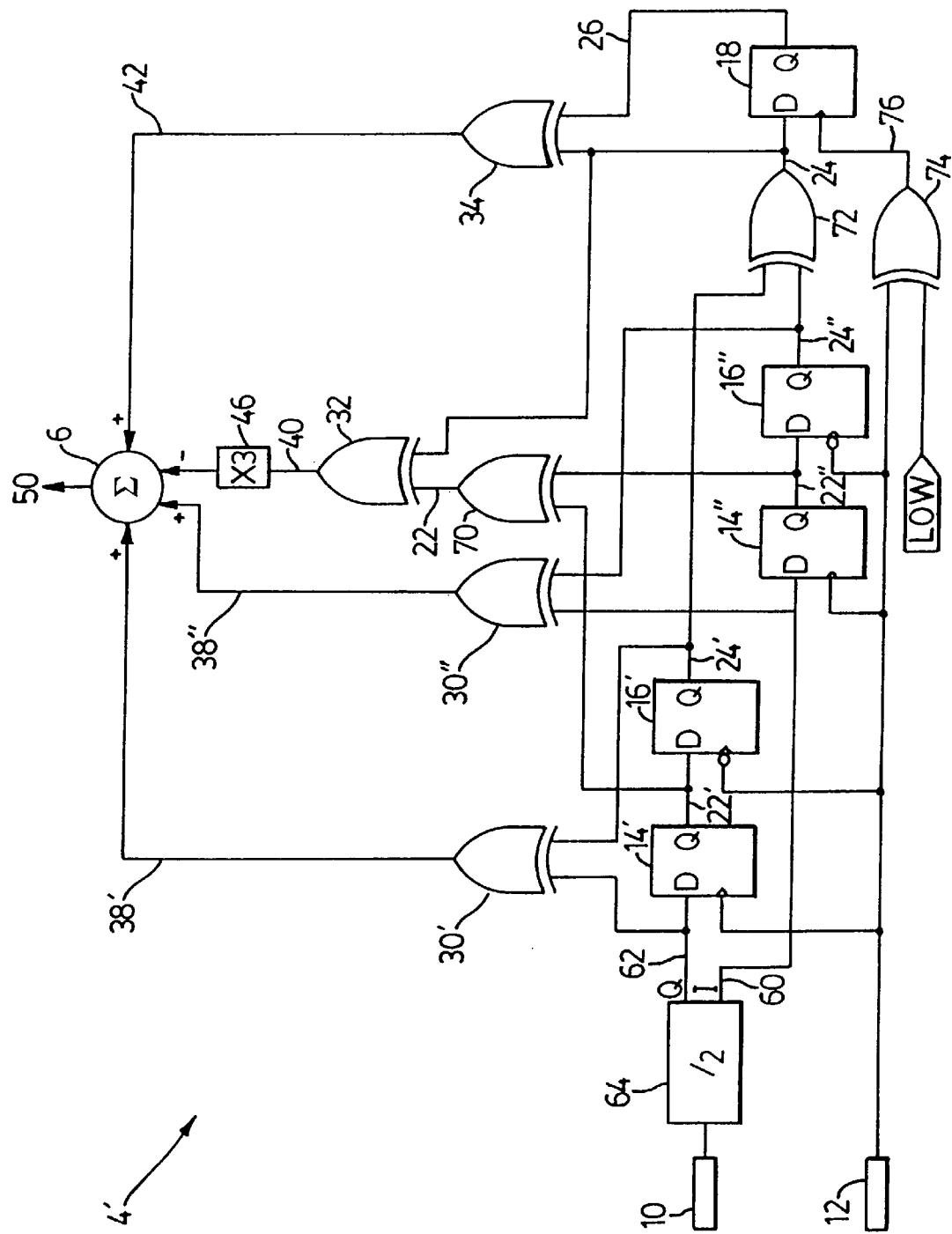

The phase detector circuit of FIG. 6 can be reduced to the circuit of FIG. 7, as will be obvious to one skilled in the art. Referring to FIG. 7, the once retimed data input signal 22 is produced or recombined by an XOR function at 70 of the once retimed divided input signals 22' and 22". Similarly the twice retimed data input signal 24 is produced or recombined by an XOR function at 72 of the twice retimed divided input signals 24' and 24". This allows retiming means 18 and XOR gates 32 and 34 to function as already described in FIG. 2A. The XOR gate 74 is necessary to match the propagation delay of XOR gate 72 (so that the width of control pulse 42 is one-half a clock period, with the accuracy of that value depending on the matching of the delay through gates 72 and 74), but otherwise XOR gate 74 does not affect the functionality of the phase detector circuit.

Figure 8:
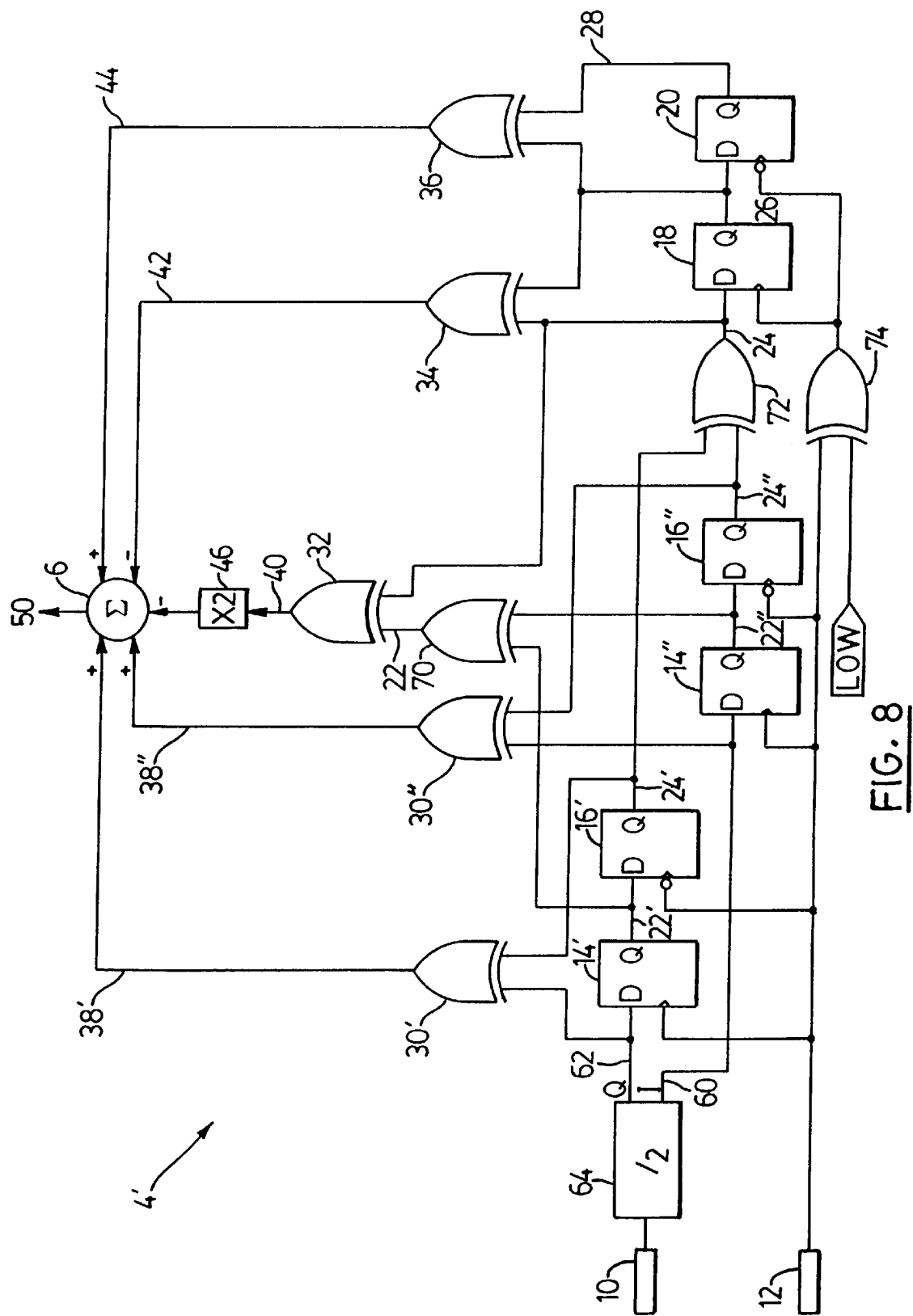
Figure 9:
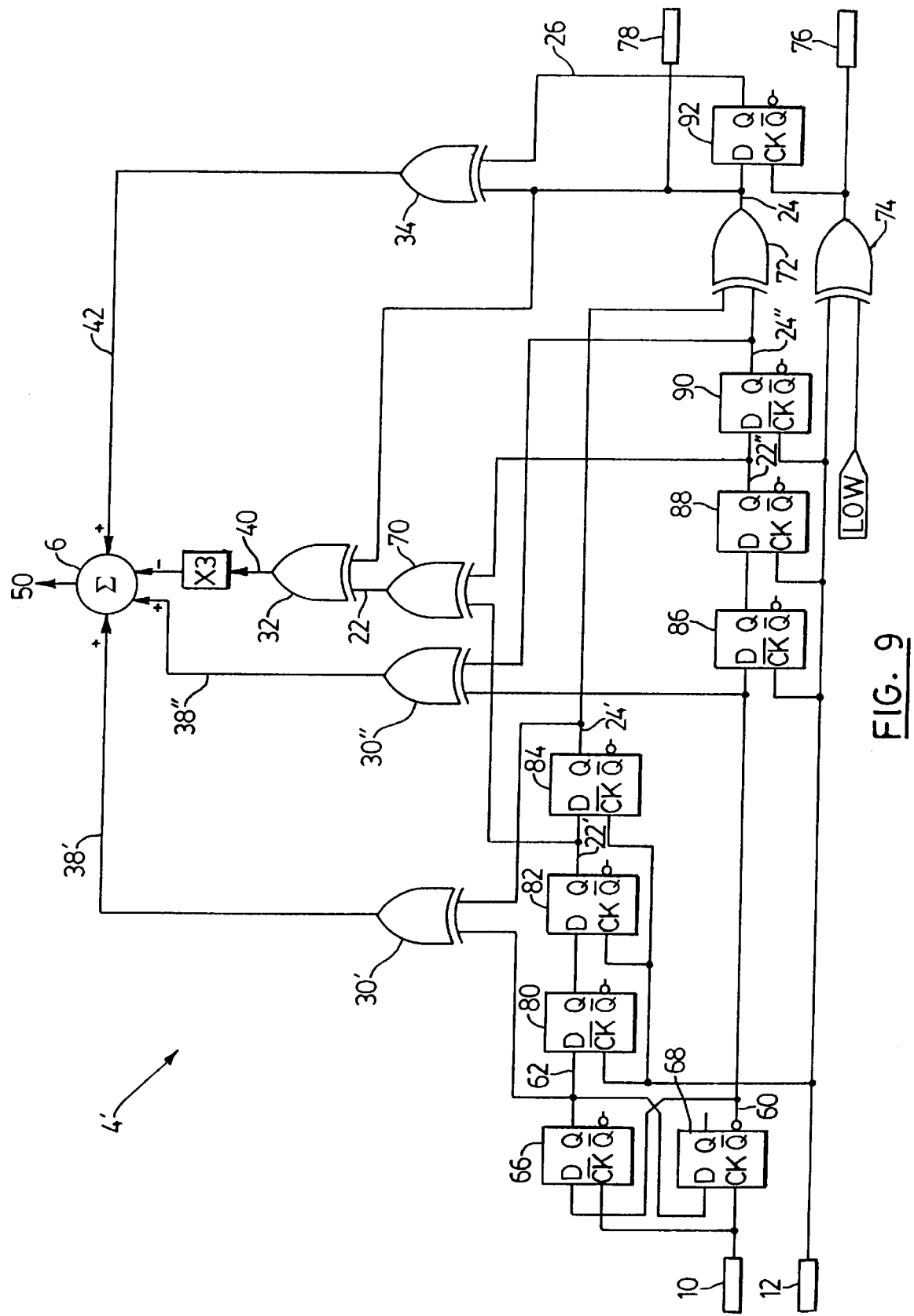

FIG. 8 shows a similar embodiment to the circuit of FIG. 7 where an additional retiming means is added in the same manner that the circuit of FIG. 2A was extended into the circuit of FIG. 2B, as already described above. FIG. 9 shows the phase detector circuit of FIG. 7 implemented with gated D-type latches replacing the flip-flops of FIG. 7 as the retiming means, in the manner explained above. In FIG. 9, latch 92 acts as a slave latch to both latches 84 and 90. Other similar functional implementations, such as of the circuits of FIG. 6 or 8 with gated D-type latches replacing the flip-flops as retiming means, will be obvious to those skilled in the art.

Figure 15:
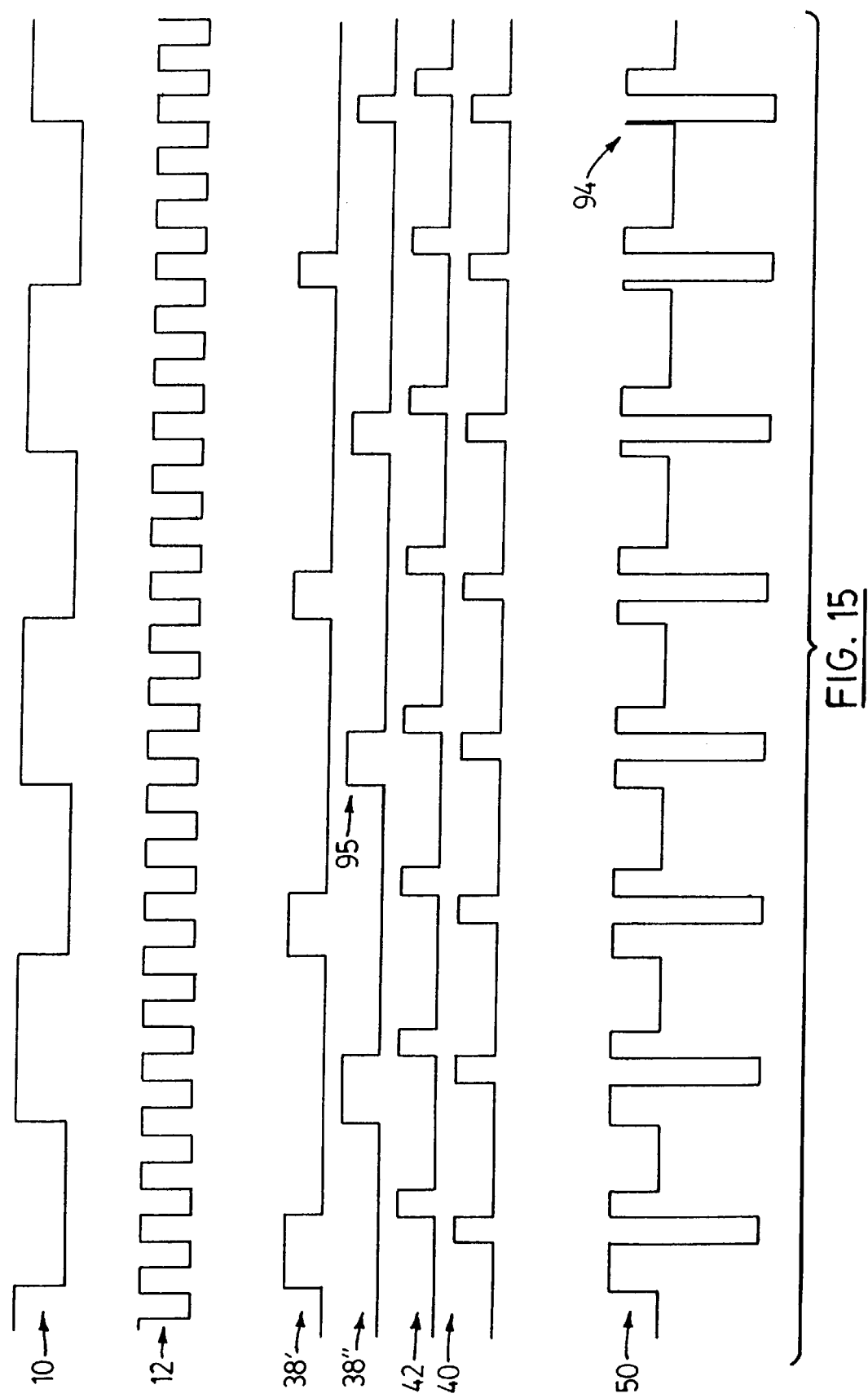
FIG. 15 shows the output waveforms for the circuit of FIG. 9.

The phase detector outputs 50 of the circuits of FIGS. 7, 8 and 9, while theoretically (i.e under ideal conditions) similar to that of FIG. 2A, do not suffer from many of the practical limitations (caused by the limits in XOR gate and control circuit response time) present in the prior art. FIG. 15 shows the output waveforms for the circuit of FIG. 9. Three UP signals 38', 38", and 42 and one DOWN signal 40 are summed to produce the phase detector output 50. UP1 38' is produced on every other input data signal transition, and UP2 38" is produced on all other data transitions. Since the occurrence of the UP1 38' or UP2 38" signal is half the frequency of that of the prior art (see signal 38 in FIG. 3), these signal pulses are made wider by one-half a clock period. As already indicated, this is achieved by making the XOR input connection across three latches (or two flip flops) versus two (or one) in the prior art. As illustrated at 94 in FIG. 15, neither UP1 38' nor UP2 38" becomes more narrow than one-half a clock period when a pulse in the phase detector output signal is very narrow. Thus, there is no distortion introduced to the phase detector transfer function.

The XOR gate 72 in FIG. 7, 8 or 9 can also be replaced with an appropriately gated retiming means with its input connected to the output of XOR gate 70 (signal 22), its output connected to the input to flip flop 18 in FIGS. 7 and 8 or to latch 92 in FIG. 9 (signal 24), and its clock input connected to the output of XOR gate 74.

Figure 10:
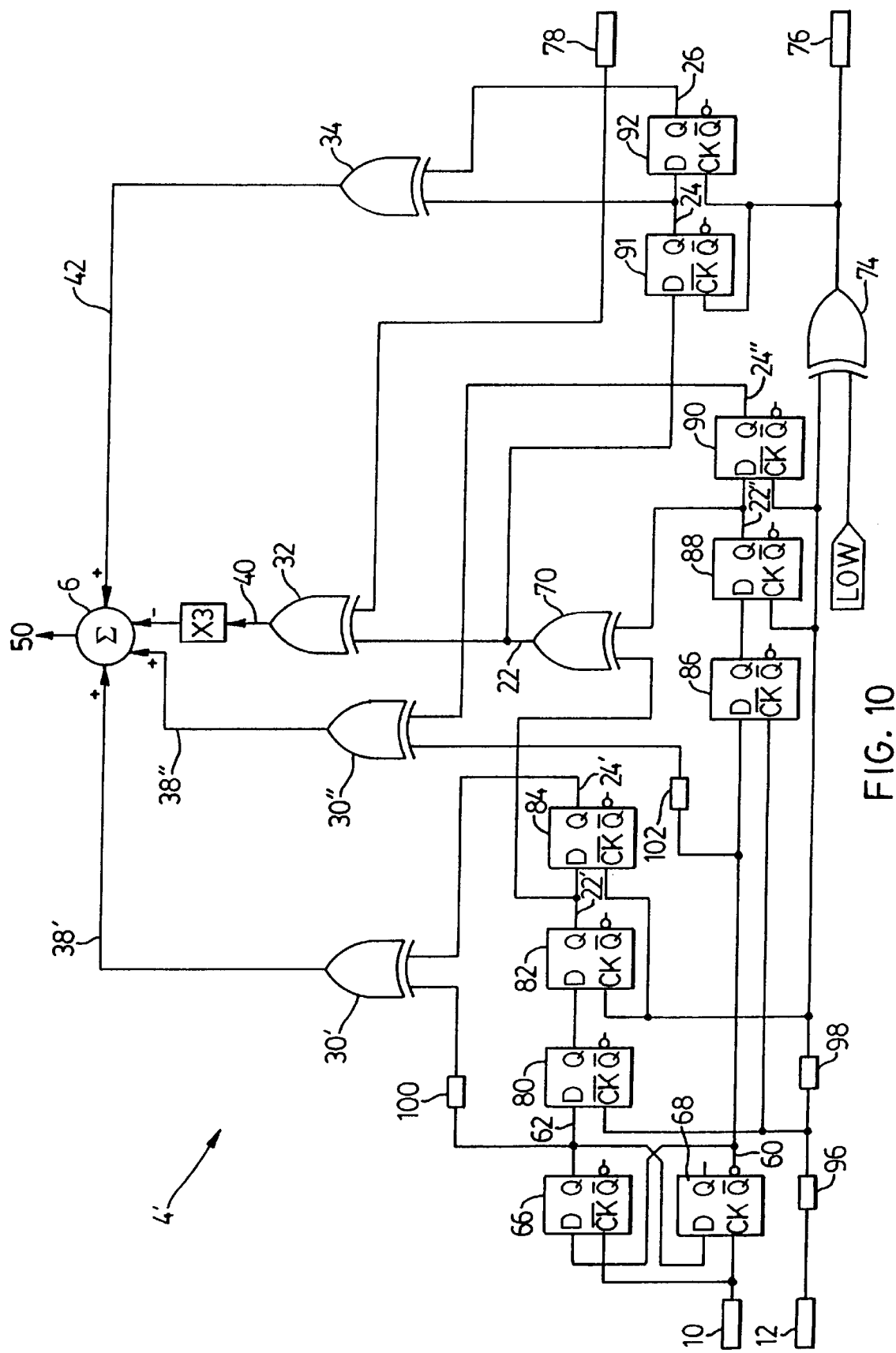

FIG. 10 shows such an implementation for the circuit of FIG. 9 with the XOR gate 72 replaced by the latch 91. In FIG. 10, which is a preferred embodiment of the present invention, XOR gate 74 matches the delay through the XOR gate 70. Delay means 96, 98, 100, and 102 are also added to the circuit of FIG. 10 to correct for the set-up time and propagation delay of the latches 80, 82, 86, and 88. Delay means 96 and 98 each provide for a delay equivalent to one data latch and may consist of a permanently enabled data latch. Delay means 100 and 102 each provide for a delay equivalent to two data latches and may consist of a combination of two permanently enabled data latches.

Delay means 96, 98, 100, and 102 can be added to the circuits of FIGS. 6 through 9 in the same manner as illustrated in FIG. 10 to correct for the inherent delays present in the retiming means of those circuits. With these delay means added to it, the circuit of FIG. 9 is functionally equivalent to the circuit of FIG. 10.

Figure 11:
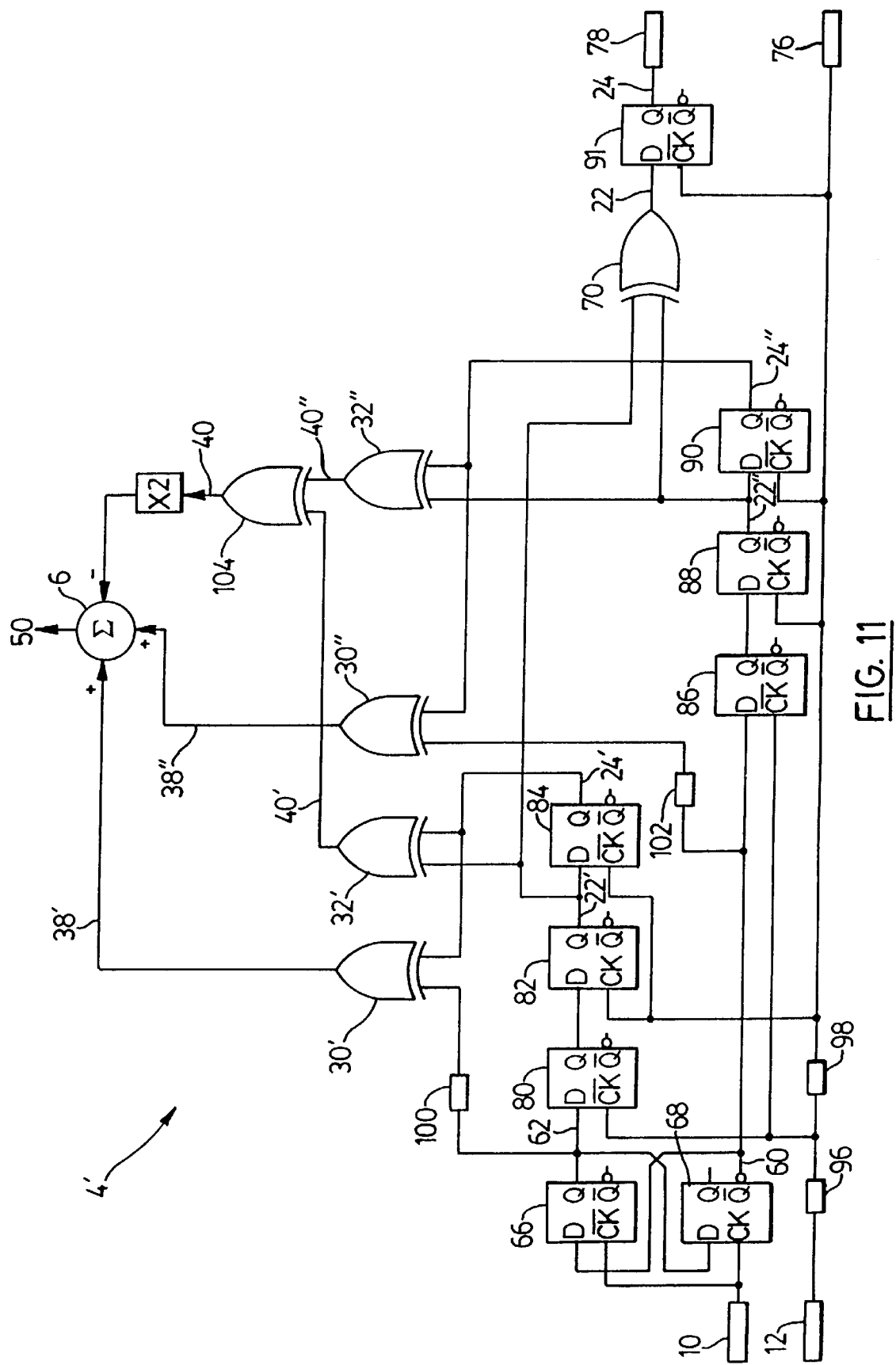

In another embodiment of the present invention, the circuit of FIG. 10 can be reduced to the circuit of FIG. 11 in which latch 92 is removed and only two retimings of the input data signal 10 effectively take place. Referring to FIG. 11, the XOR gates 32' and 32" perform the same function as the identically labelled gates in FIG. 6 in generating signals 40' and 40" respectively. In the FIG. 11 embodiment of the present invention, the DOWN signal 40 is generated by an OR function at gate 104 of the signals 40' and 40". Because a data transition in one of the divided data signals always occurs at least one data interval apart from a data transition in the other divided data signal, and because the clock frequency must be at least twice high as the data or bit rate, the pulse signals 40' and 40" are never high at the same time and OR gate 104 effectively sums these two signals. Also, since the circuit of FIG. 11 generates the DOWN pulse 40 without using XOR gate 70, the need for a delay via XOR gate 74 in FIG. 10 is obviated.

Figure 16A:
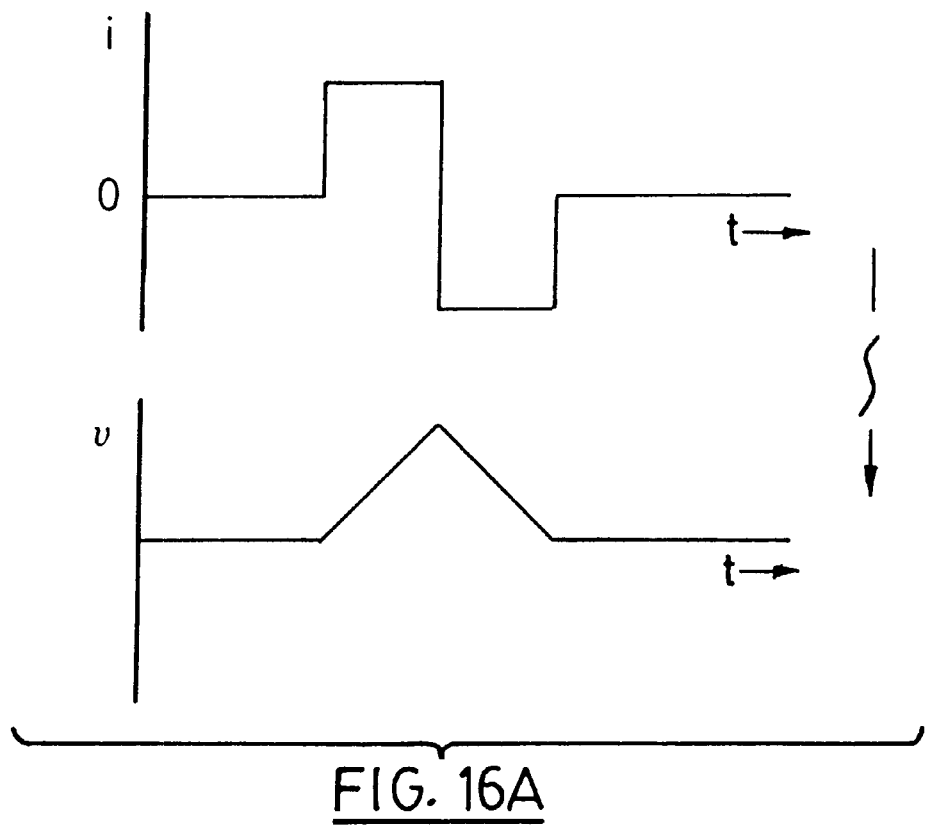
FIGS. 16A and 16B illustrate the average of phase detector output signals in relation to the average of the time integrals of those signals.
Figure 16B:
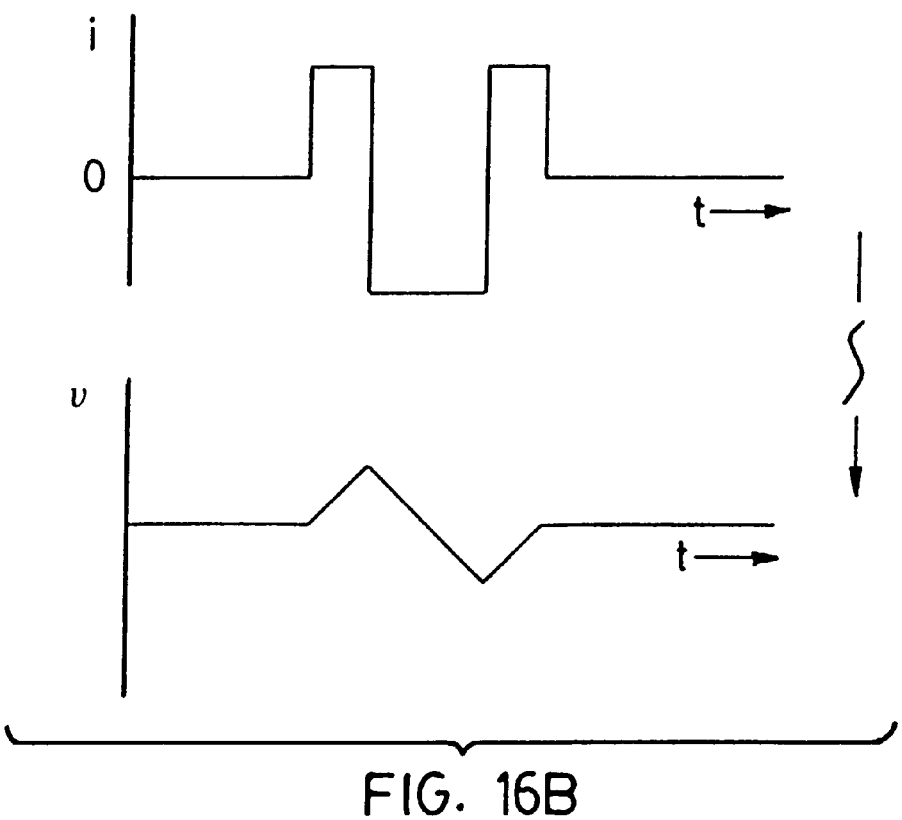

When an input data transition occurs with zero phase error, the phase of the VCO output should not change, and therefore the average value of the phase error signal or VCO input (i.e. the filtered and integrated phase detector output signal) should not change. However, while the average change in the phase detector output signal 50 in response to an input data transition may be zero, the average change in the integrated phase detector output (the phase error signal 9 in FIG. 1) may still be non-zero. This concept is illustrated by way of example in FIGS. 16A and 16B. As a result, for phase detector outputs such as that shown in FIG. 16A, a non-zero phase offset will result when there are variations in the density of input data transitions. This "pattern dependent jitter" may occur in wideband systems.

Unlike the phase detector circuits of FIGS. 6 through 10 which do not suffer from pattern dependent jitter (this can be seen, for example, by the form of the phase detector output waveform in FIG. 15 at time 95), the phase detector output of the circuit of FIG. 11 does suffer from this drawback. To solve this problem, the phase detector circuit of FIG. 11 is further modified into the circuit of FIG. 12.

Figure 12:
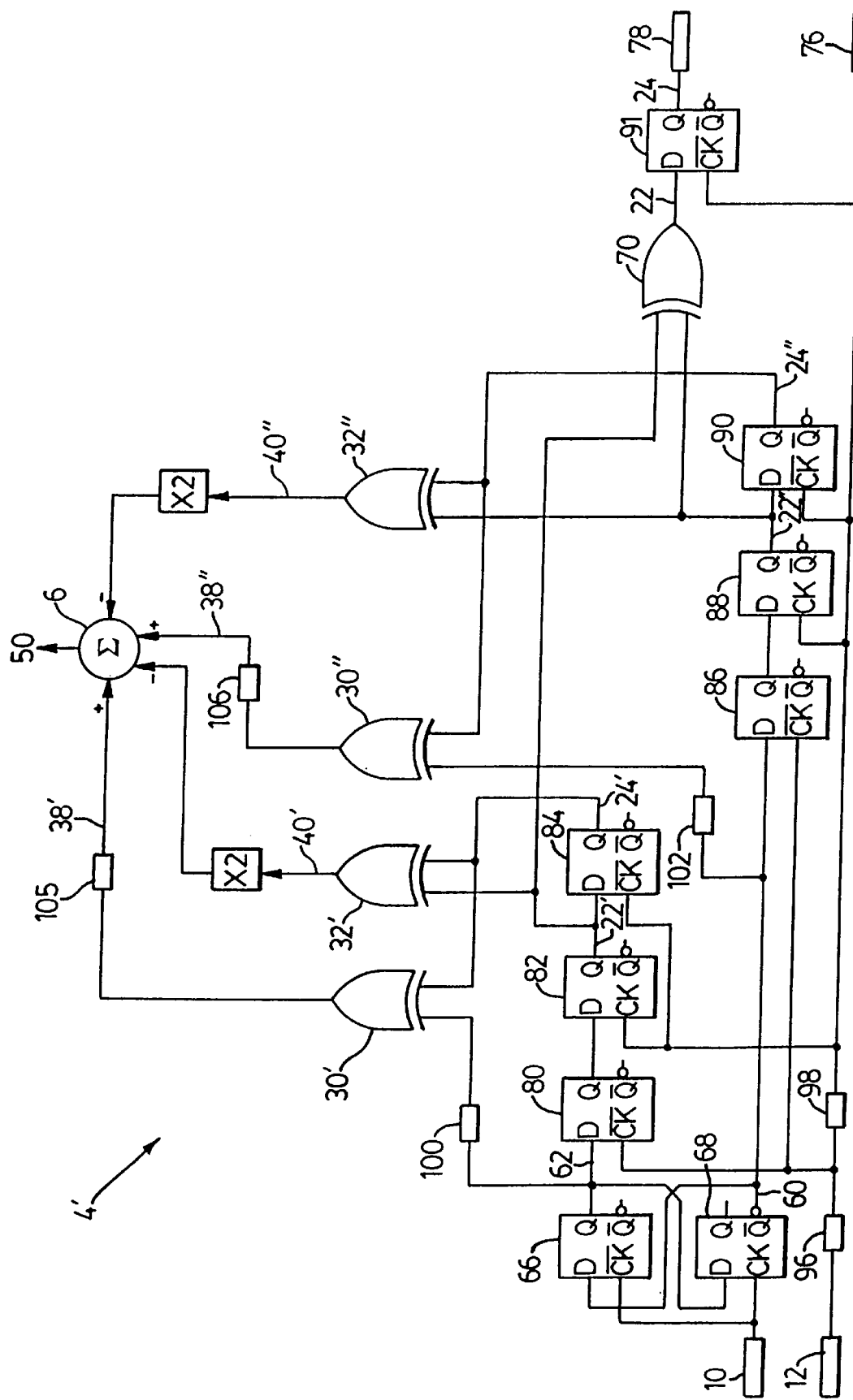

In the circuit of FIG. 12, which is a preferred embodiment of the present invention, the OR gate 104 (and the delay through it) is removed and the summing of the DOWN pulses 40' (DOWN1) and 40" (DOWN2) takes place at the control summing circuit 6. Delay means 105 and 106, each providing a delay of one-quarter of the clock period are also added to delay the arrival of the UP1 and UP2 signals at the summing circuit 6 relative to the DOWN pulses. The phase detector circuit of FIG. 12 is advantageous when a phase detector circuit is to be used in a single clock frequency PLL system, since the delays 105 and 106 are fixed value delays which are easily implemented. The circuit of FIG. 12 may also be used in a multi-clock frequency PLL system, but the delay means 105 and 106 are variable and therefore more complex.

Figure 17:
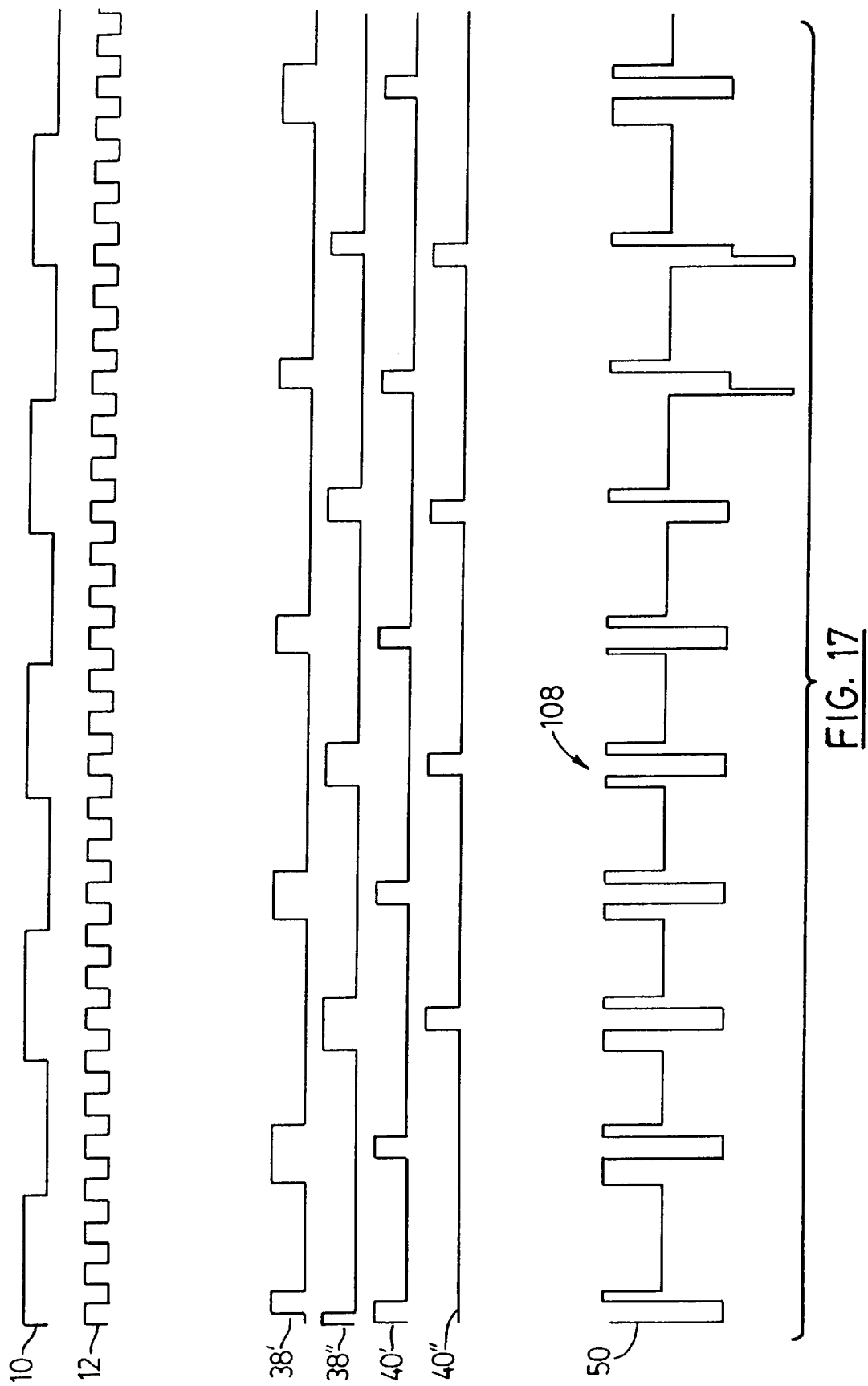
FIG. 17 shows the output waveforms for the circuit of FIG. 12.

FIG. 17 shows the output waveforms for the circuit of FIG. 12. As shown at 108 in FIG. 17, when the circuit is phase-locked (i.e. there is no phase error) the corresponding UP and DOWN pulses overlap so that the phase detector output pulses one unit high for one-quarter clock period, pulses one unit low for one-half clock period, and pulses one unit high again for one-quarter clock period. In the prior art circuit of FIG. 2A and in the FIGS. 6, 7, 9 and 10 embodiments of the present invention, a phase locked phase detector output pulses one unit high for one-half clock period, pulses two units low for one-half clock period, and pulses one unit high for one-half clock period. As a result, the circuit of FIG. 12 produces a lower peak-to-peak voltage signal on the loop filter and therefore less jitter than in the prior art. This lower peak-to peak voltage signal is also achieved by the prior art circuit of FIG. 2B and the circuit of FIG. 8 in the present invention, but at the expense of requiring supplemental circuitry to generate an additional control pulse signal as well as the expense of requiring a longer time interval to measure phase error.

Figure 18:
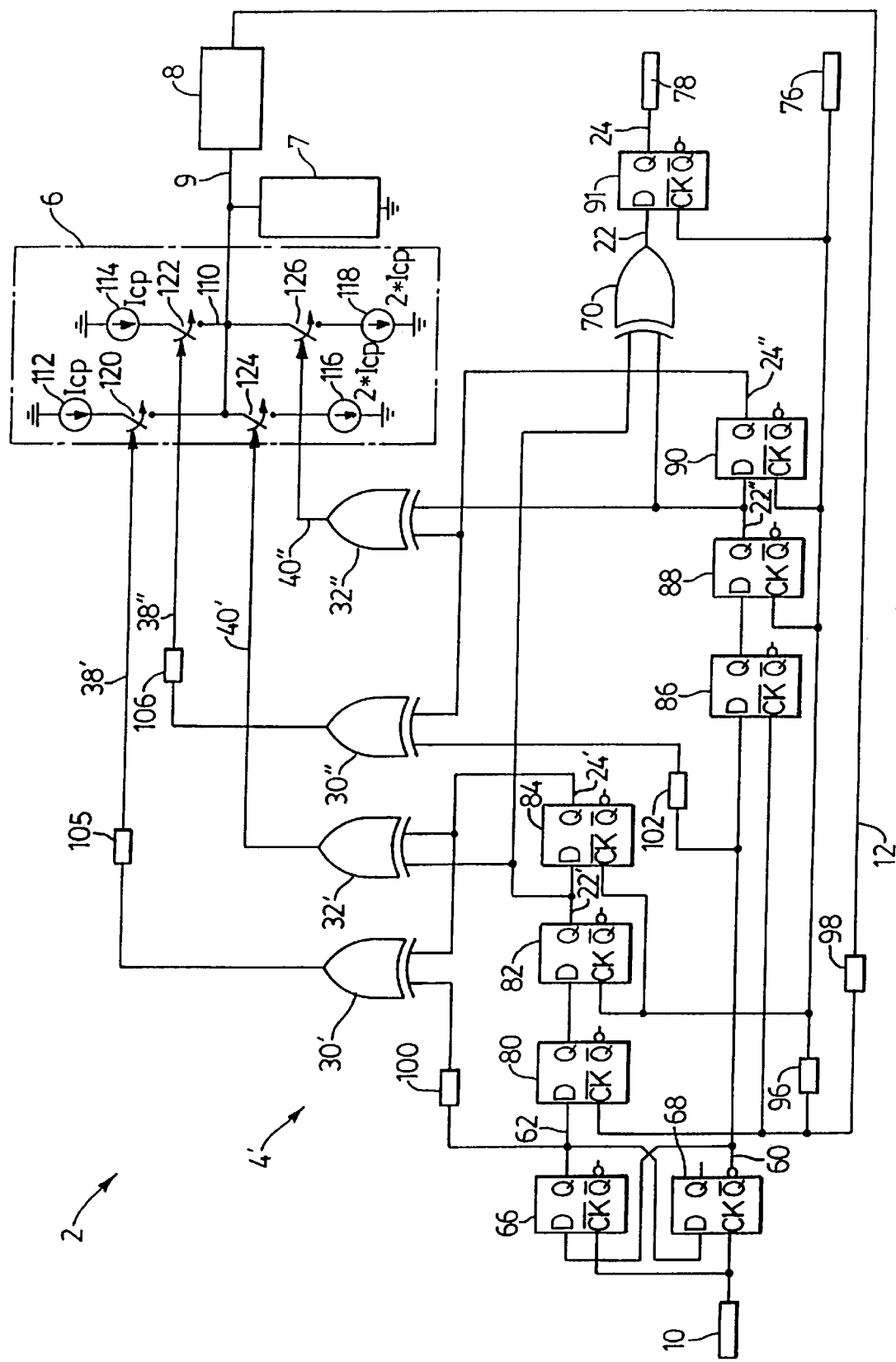
FIG. 18 shows the phase detector circuit of FIG. 12 with control circuitry in a phase-locked loop.

The complete phase detector for the preferred embodiment in FIG. 12 with charge pump control circuitry 6 is shown in a phase-locked loop in FIG. 18. The control pulse (UP and DOWN) signals are used to control, by way of switches 120, 122, 124, and 126, the charge pump 6 which comprises current sources 112, 114, 116 and 118 working into a loop filter 7 which processes the phase detector output signal and which may comprise a resistor-capacitor network. The filter 7 achieves both the integration of the current signal pulses and a low pass filter function to define the PLL bandwidth. Similarly to the XOR gates which generate the control pulses, the switches 120, 122, 124, and 126 in the charge pump 6 have limited bandwidth and thus require control pulses of some minimum width. Since there is no circuitry associated with the summing function in this implementation, further bandwidth limiting the narrow output pulses of the phase detector output is avoided. The summing function is simply the connection of the current sources into one common node 110 where the loop filter 7 is connected. Although node 110 is shown as single-ended, the specific configuration, whether single-ended or differential, is not significant. Similar charge pump summation circuitry can be implemented for any embodiments of the present invention.

The charge pump 6 receives a net positive (or UP) pulse when the clock lags the input serial data and dumps a net positive charge packet into the resistor-capacitor network (loop filter) 7 to increase the VCO frequency. Where no input serial data transitions occur, no charge is added or removed from the loop filter 7, and the VCO frequency remains unchanged. Therefore, only when input data transitions occur, does the phase detector provide control signal pulses of net width proportional to the phase difference of the input data and clock signals.

The feedback of the PLL 2 will force the pulse widths of UP1 38' and UP2 38" to equal twice that of the DOWN1 and DOWN2 pulses 40' and 40" (for example, at 108 in FIG. 17.) The width of the DOWN pulses is one-half the clock period, and the accuracy of that value depends on the matching of the delay from the clock input to the output of D latches 82 and 84 for DOWN1 and from the clock input to the output of D latches 86 and 88 for DOWN2. In order to achieve zero static phase offset, the width of UP1 and UP2 depend on the matching of the gate delays for the arrival of each of the inputs to XOR gates 30' and 30" respectively, and are determined by the time from a data transition to a positive clock edge plus one-half a clock period. Therefore, the PLL 2 locks when the time from a data transition to a positive clock edge equals one-half a clock period.

The value of Iup1 112 and Iup2 114 must equal one-half the value of Idown1 116 and Idown2 118 to ensure the condition of zero static phase offset. The clock output 76 is synchronized to the regenerated data 78 (Data Out) so that the positive edge of the clock occurs one-half a data bit-period after the data transition.

It should once again be noted that the present invention is not limited to embodiments which frequency divide the input data signal by two but rather may generally include frequency division of the input by an integer N which is greater than two, so as to provide a plurality of N divided signals. Preferably, the number of divided signals N is a positive integer power of two (i.e. N equals $2^M$ where M is a positive integer so that N may equal 2, 4, 8, etc.) since the N divided signals may then be obtained by further dividing each signal in a preceding set of divided signals (until the required number of divided signals is obtained) in the same manner that the initial set of divided signals was obtained. Note that if the widths of the control pulses are lengthened, it will be necessary to frequency divide the input signal by a number greater than two in order to ensure the resolution of consecutive data transitions in the input signal.

While preferred embodiments of the invention have been described, it will be realized that the embodiments disclosed are illustrative and not restrictive, and that all changes within the meaning and spirit of the invention are intended to be embraced by the appended claims.

We claim:

1. A phase detector circuit for detecting a phase difference between an information signal and a clock signal and for producing a phase error signal representative of said phase difference, said clock signal and said information signal being pulse waveforms having first and second levels and having first and second edges, said information signal containing data at a certain data rate and said first and second edges of said information signal being data transitions, said phase detector circuit comprising:

(a) divider circuit for dividing said information signal into a plurality N of divided signals, N being equal to $2^M$ where the number M is a positive integer greater than or equal to one, and the data rate of each of said divided signals being the data rate of said information signal divided by N;

(b) pulse signal circuit coupled to said divider circuit for producing a plurality N of variable width difference pulse signals, each of said difference pulse signals being responsive to the phase difference between one of said divided signals and said clock signal, the width of each of said difference pulse signals being not less than the width between said first and second edges of said clock signal, said pulse signal circuit further producing one or more fixed width reference pulse signals and the width of each of said one or more reference pulse signals being proportional to the width between said first and second edges of said clock signal; and (c) a phase error signal circuit coupled to said pulse signal circuit for producing said phase error signal in response to said plurality of difference pulse signals and said one or more reference pulse signals.

2. A phase detector circuit according to claim 1 in which N equals two, so that said divider circuit divides said information signal into a first divided signal and a second divided signal, the data rate of said first divided signal and said second divided signal being one half the data rate of said information signal.

3. A phase detector circuit according to claim 2 in which said pulse signal circuit produces a first difference pulse signal responsive to the phase difference between said first divided signal and said clock signal, a second difference pulse responsive to the phase difference between said second divided signal and said clock signal, and said one or more reference pulse signals such that the time average of the changes in said phase error signal is zero when the second edge of said clock signal coincides with a data transition of said information signal.

4. A phase detector circuit according to claim 3 in which said phase error signal circuit comprises:

(a) a first switchable current source operative in response to said first difference pulse signal and coupled between a common node and a reference node;

(b) a second switchable current source operative in response to said second difference pulse signal and coupled between said common node and said reference node;

(c) one or more additional switchable current sources, each of said one or more additional switchable current sources being operative in response to one of said one or more reference pulse signals and each of said one or more additional current sources being coupled between said common node and said reference node;

so that said first, said second, and said one or more additional switchable current sources generate a combined pulse signal between said common node and said reference node; and (d) a pulse signal processing circuit coupled between said common node and said reference node for integrating and filtering said combined pulse signal to produce said phase error signal.

5. A phase detector circuit according to claim 1 in which said phase error signal circuit comprises:

(a) a plurality of switchable current sources, each of said current sources being operative in response to one of said plurality of difference pulse signals or one of said one or more reference pulse signals, each of said plurality of switchable current sources being coupled between a common node and a reference node, said plurality of switchable current sources generating a combined pulse signal between said common node and said reference node; and (b) a pulse signal processing circuit coupled between said common node and said reference node for integrating and filtering said combined pulse signal to produce said phase error signal.

6. A phase detector circuit according to claim 2 which said divider circuit generates said first divided signal and said second divided signal such that said first divided signal changes levels in response to said first edge of said information signal and said second divided signal changes levels in response to said second edge of said information signal.

7. A phase locked loop circuit comprising a phase detector circuit according to claim 2 coupled to a voltage controlled oscillator, wherein said voltage controlled oscillator generates said clock signal in response to said phase error signal.

8. A phase detector circuit according to claim 2 wherein said pulse signal circuit comprises a first processing circuit for processing said first divided signal and a second processing circuit for processing said second divided signal, each of said first and second processing circuits being coupled to said divider circuit and each of said first and second processing circuits comprising (a) a first retiming circuit having a data input and a data output, said data input of said first retiming circuit being connected to said first divided signal or said second divided signal, said first retiming circuit being gated by said clock signal, (b) a second retiming circuit having a data input and a data output, said data input of said second retiming circuit being connected to the data output of said first retiming circuit, said second retiming circuit being gated by said clock signal, (c) a first exclusive-OR circuit having a first input, a second input, and an output, said first input of said first exclusive-OR circuit being connected to said first divided signal or said second divided signal, and said second input of said first exclusive-OR circuit being connected to the data output of said second retiming means, the output of said first exclusive-OR circuit providing one of the variable width difference pulse signals, and (d) a second exclusive-OR circuit having a first input, a second input, and an output, said first input of said second exclusive-OR circuit being connected to the data output of said first retiming means, and said second input of said second exclusive-OR circuit being connected to the data output of said second retiming means, the output of said second exclusive-OR circuit providing one of the fixed width reference pulse signals.

9. A phase detector circuit according to claim 8 in which the time average of the changes in said phase error signal is zero when the second edge of said clock signal coincides with a data transition of said information signal.

10. A phase detector circuit according to claim 9 in which said first exclusive-OR circuit of said first processing circuit includes a first delay circuit for delaying the output of said first exclusive-OR circuit of said first processing circuit, and said first exclusive-OR circuit of said second processing circuit includes a second delay circuit for delaying the output of said first exclusive-OR circuit of said second processing circuit, each of said first delay circuit and said second delay circuit providing a delay of one half the width between said first and second edges of said clock signal.

11. A phase detector circuit according to claim 8 in which each of said first retiming circuit of said first processing circuit and said first retiming circuit of said second processing circuit comprises a flip-flop being triggered by the first edge of said clock signal and each of said second retiming circuit of said first processing circuit and said second retiming circuit of said second processing circuit comprises a flip-flop being triggered by the second edge of said clock signal.

12. A phase detector circuit according to claim 8 wherein:

each of said first retiming circuit of said first processing circuit and said first retiming circuit of said second processing circuit comprises a master and slave combination of a first latch and a second latch, wherein said first latch is enabled by the first level of said clock signal and said second latch is enabled by the second level of said clock signal, and each of said second retiming circuit of said first processing circuit and said second retiming circuit of said second processing circuit comprises a master and slave combination of two latches, wherein said first latch is enabled by the second level of said clock signal and said second latch is enabled by the first level of said clock signal.

13. A phase detector circuit according to claim 8 in which said phase error signal circuit comprises:

(a) a first switchable current source operative in response to the output of said first exclusive-OR circuit of said first processing circuit and coupled between a common node and a reference node;

(b) a second switchable current source operative in response to the output of said second exclusive-OR circuit of said first processing circuit and coupled between said common node and said reference node;

(c) a third switchable current source operative in response to the output of said first exclusive-OR circuit of said second processing circuit and coupled between said common node and said reference node;

(d) a fourth switchable current source operative in response to the output of said second exclusive-OR circuit of said second processing circuit and coupled between said common node and said reference node;

so that said first, said second, said third, and said fourth switchable current sources generate a combined pulse signal between said common node and said reference node;

(d) a pulse signal processing circuit coupled between said common node and said reference node for integrating and filtering said combined pulse signal to produce said phase error signal.

14. A phase locked loop circuit comprising a phase detector circuit according to claim 8 coupled to a voltage controlled oscillator, wherein said voltage controlled oscillator generates said clock signal in response to said phase error signal.

15. A phase detector circuit according to claim 2 wherein said pulse signal circuit comprises (a) a first processing circuit for processing said first divided signal and a second processing circuit for processing said second divided signal, each of said first and second processing circuits being coupled to said divider circuit and each of said first and second processing circuits comprising a first retiming circuit having a data input and a data output, said data input of said first retiming circuit being connected to said first divided signal or said second divided signal, said first retiming circuit being gated by said clock signal, a second retiming circuit having a data input and a data output, said data input of said second retiming circuit being connected to the data output of said first retiming circuit, said second retiming circuit being gated by said clock signal, and a first exclusive-OR circuit having a first input, a second input, and an output, said first input of said first exclusive-OR circuit being connected to said first divided signal or said second divided signal, and said second input of said first exclusive-OR circuit being connected to the data output of said second retiming means, the output of said first exclusive-OR circuit providing one of the variable width difference pulse signals;

(b) a recombining circuit coupled to said first and second processing circuits for recombining the signal at said data output of said first retiming means of said first processing circuit and the signal at said data output of said first retiming means of said second processing circuit to produce a once retimed information signal;

(c) a fifth retiming circuit having a data input and a data output, said data input of said fifth retiming circuit being connected to said once retimed information signal, said fifth retiming circuit being gated by said clock signal;

(d) a sixth retiming circuit having a data input and a data output, said data input of said sixth retiming circuit being connected to the data output of said fifth retiming means, said sixth retiming means being gated by said clock signal;

(e) a third exclusive-OR circuit having a first input, a second input, and an output, said first input of said third exclusive-OR circuit being connected to said once retimed information signal, and said second input of said third exclusive-OR circuit being connected to said data output of said fifth retiming means, the output of said first exclusive-OR circuit providing one of the fixed width reference pulse signals, and (f) a fourth exclusive-OR circuit having a first input, a second input, and an output, said first input of said fourth exclusive-OR circuit being connected to said data output of said fifth retiming means, and said second input of said fourth exclusive-OR circuit being connected to said data output of said sixth retiming means, the output of said first exclusive-OR circuit providing one of the fixed width reference pulse signals.

16. A phase detector circuit according to claim 15, in which the time average of the changes in said phase error signal is zero when the second edge of said clock signal coincides with a data transition of said information signal.

17. A method for detecting a phase difference between an information signal and a clock signal and for producing a phase error signal representative of said phase difference, said clock signal and said information signal being pulse waveforms having first and second levels and having first and second edges, said information signal containing data at a certain data rate and said first and second edges of said information signal being data transitions, said method comprising the steps of:

(a) a dividing said information signal into a plurality N of divided signals, N being equal to $2^M$ where the number M is a positive integer greater than or equal to one, and the data rate of each of said divided signals being the data rate of said information signal divided by N;

(b) producing a plurality N of variable width difference pulse signals each of said difference pulse signals being responsive to the phase difference between one of said divided signals and said clock signal, the width of each of said difference pulse signals being not less than the width between said first and second edges of said clock signal;

(c) producing one or more fixed width reference pulse signals and the width of each of said one or more reference pulse signals being proportional to the width between said first and second edges of said clock signal; and (d) producing said phase error signal in response to said plurality of difference pulse signals and said one or more reference pulse signals.

18. A method according to claim 17 wherein in step (a) N equals two so that said information signal is divided into a first divided signal and a second divided signal, the data rate of said first divided signal and said second divided signal being one half the data rate of said information signal.

19. A method according to claim 17 in which step (d) comprises producing said phase error signal such that the time average of the changes in said phase error signal is zero when the second edge of said clock signal coincides with a data transition of said information signal.

* * * * *